United States Patent
Hatakeyama

(10) Patent No.: US 9,224,897 B2
(45) Date of Patent: Dec. 29, 2015

(54) BACK SHEET FOR SOLAR CELL, AND SOLAR CELL MODULE

(71) Applicant: FUJIFILM Corporation, Tokyo (JP)

(72) Inventor: Akira Hatakeyama, Kanagawa (JP)

(73) Assignee: FUJIFILM CORPORATION, Tokyo (JP)

( * ) Notice: Subject to any disclaimer, the term of this patent is extended or adjusted under 35 U.S.C. 154(b) by 0 days.

(21) Appl. No.: 13/890,616

(22) Filed: May 9, 2013

(65) Prior Publication Data

US 2013/0291942 A1    Nov. 7, 2013

Related U.S. Application Data

(63) Continuation of application No. PCT/JP2011/076107, filed on Nov. 11, 2011.

(30) Foreign Application Priority Data

Nov. 12, 2010    (JP) ................................ 2010-254207

(51) Int. Cl.
| | |
|---|---|
| H01L 31/049 | (2014.01) |
| H01L 31/048 | (2014.01) |
| B32B 27/20 | (2006.01) |
| B32B 27/30 | (2006.01) |
| B32B 27/32 | (2006.01) |
| B32B 27/08 | (2006.01) |
| B32B 27/26 | (2006.01) |
| B32B 27/36 | (2006.01) |

(52) U.S. Cl.
CPC ............ *H01L 31/0487* (2013.01); *B32B 27/08* (2013.01); *B32B 27/20* (2013.01); *B32B 27/26* (2013.01); *B32B 27/306* (2013.01); *B32B 27/308* (2013.01); *B32B 27/32* (2013.01); *B32B 27/36* (2013.01); *H01L 31/049* (2014.12); *B32B 2264/10* (2013.01); *B32B 2457/12* (2013.01); *Y02E 10/52* (2013.01)

(58) Field of Classification Search
CPC ... H01L 31/042; H01L 31/048; H01L 31/049; Y02E 10/52
USPC ................... 136/251, 252, 256, 259
See application file for complete search history.

(56) References Cited

U.S. PATENT DOCUMENTS

| | | | |
|---|---|---|---|
| 2002/0034696 A1* | 3/2002 | Wolf et al. | ......... 430/7 |
| 2010/0000603 A1 | 1/2010 | Tsuzuki et al. | |
| 2011/0306747 A1* | 12/2011 | Hashimoto et al. | ........ 528/83 |

FOREIGN PATENT DOCUMENTS

| | | |
|---|---|---|
| JP | 2000-243999 A | 9/2000 |
| JP | 2006-253565 A | 9/2006 |
| JP | 2006-335853 A | 12/2006 |
| JP | 2007-150084 A | 6/2007 |
| JP | 2009-158952 A | 7/2009 |
| JP | 2010-093120 A | 4/2010 |
| JP | 2010-109240 A | 5/2010 |
| JP | 2010-138310 A | 6/2010 |
| JP | 2010-158828 A | 7/2010 |
| JP | 2010-165873 A | 7/2010 |
| JP | 2010-251679 A | 11/2010 |
| JP | 2011-146658 A | 7/2011 |
| JP | 2011-146659 A | 7/2011 |
| WO | 2010-067780 A1 | 6/2010 |

OTHER PUBLICATIONS

JP2010109240, Ueda et al. machine translation.*
Office Action issued by the Japanese Patent Office (JPO) on Sep. 2, 2014, in connection with corresponding Japanese Patent Application No. 2011-247871.
Office Action issued by the Japanese Patent Office (JPO) on Dec. 2, 2014 in connection with Japanese Patent Application No. 2011-247871.
First Office Action issued by the State Intellectual Property Office (SIPO) of China on Mar. 19, 2015 in connection with Chinese Patent Application No. 201180053985.9.

* cited by examiner

*Primary Examiner* — Susan D Leong
(74) *Attorney, Agent, or Firm* — Jean C. Edwards, Esq.; Edwards Neils PLLC

(57) ABSTRACT

A solar cell backsheet including: a support; and a first polymer layer which is formed on one side of the support and which includes: from 0.8 g/m² to 15.0 g/m² of a binder resin including at least one selected from the group consisting of a polyolefin ionomer having a polar group, a polyacryl, and polyvinyl alcohol; and from 1.5 g/m² to 15.0 g/m² of an inorganic pigment.

15 Claims, No Drawings

BACK SHEET FOR SOLAR CELL, AND SOLAR CELL MODULE

CROSS-REFERENCE TO RELATED APPLICATIONS

This application is a continuation application of, and claims priority to, International Application No. PCT/JP2011/076107, filed Nov. 11, 2011, which was published under PCT Article 21(2) in Japenese, which is incorporated herein by reference. Further, this application claims priority from Japanese Patent Application No. 2010-254207, filed Nov. 12, 2010, which is incorporated herein by reference.

TECHNICAL FIELD

The present invention relates to a backsheet for a solar cell which is to be disposed on the opposite side from the light-receiving side of a photovoltaic element, and a solar cell module.

BACKGROUND ART

Solar cells are recently rapidly become popular because the cells do not emit carbon dioxide during the generation of electricity and are more environment-friendly.

Solar cell modules typically include a photovoltaic element (cell) disposed between a top surface glass, on which solar light is incident and a backsheet for a solar cell (hereinafter simply referred to as "backsheet") on the opposite side of the side on which solar light is incident (on the backside). The solar cell modules include an encapsulant such as an ethylene-vinyl acetate (EVA) resin in a space between the top surface glass and the cell and a space between the cell and the backsheet.

The backsheet acts to prevent intrusion of moisture from the backside of a solar cell module. Although glass, fluorinated resin, and the like have been conventionally used for the backsheet, polyester is increasingly used in view of cost reduction.

A backsheet may be more than a mere polymer sheet and may be provided with various functions. For example, a white layer may be provided to the backsheet to provide higher reflectance, thereby using the reflected light to improve efficiency of power generation, or a pigmented blue or black layer is disposed to improve design (See, for example, Japanese Patent Application Laid-Open (JP-A) No. 2010-93120). As described above, it is advantageous to provide a layer to which a white or colored inorganic pigment has been added in view of assuring adequate reflectivity and design.

On the other hand, a backsheet should have good adhesion to an encapsulant. Especially, the backsheet should not separating from an encapsulant even after long storage under damp heat atmosphere, because the solar cell modules are installed outdoor.

JP-A No. 2000-243999 discloses a technique for improving adhesion by corona discharge treatment.

JP-A No. 2011-146658 discloses a backsheet including, on a polymer substrate, a colored layer which includes binder and a specified amount of pigment; and a readily adherable layer which includes a specified amount of binder and inorganic fine particles.

JP-A No. 2011-146659 discloses a backsheet film formed by applying, to a substrate film, an aqueous composition for a white layer including a white pigment, an aqueous binder, and an inorganic oxide filler, and an aqueous composition for an adhesive protective layer including an aqueous binder to form the white layer and the adhesive protective layer, respectively.

SUMMARY OF INVENTION

Problems to be Solved by the Invention

A conventional solar cell backsheet has been formed by sticking a polyester support, a white or colored sheet, a fluorinated sheet, and the like. Such a backsheet has a high reflectance and thus have advantages in terms of efficiency of power generation. However, when this type of backsheet is viewed from a module surface, a white part of the backsheet is seen around the cell (blue gray), which is undesirable in terms of designing property. Thus, a backsheet surface facing to the cell may be colored black or blue. Although such backsheet has a good design, the backsheet may exhibit inadequate adhesion between the white or colored layer and the encapsulant. In order to address this, for example, corona discharge treatment can be used to improve adhesion before damp heat aging. However, the backsheets treated by corona discharge exhibit inadequate adhesion after a long-term damp heat aging. For example, such backsheet may cause separation after damp heat aging.

The present invention has been developed in view of the foregoing, and may provide a backsheet for a solar cell which has good design and/or reflection as well as good adhesion to an encapsulant and which is less likely to separate from an encapsulant even after damp heat aging; and a solar cell module which can stably retain its electricity generation performance for a long time.

Means of Solving the Problems

Concrete means of solving the problems described above are as follows:

<1> A backsheet for a solar cell, the backsheet comprising: a support; and a first polymer layer which is formed on one side of the support and which comprises: from 0.8 g/m$^2$ to 15.0 g/m$^2$ of a binder resin comprising at least one selected from the group consisting of a polyolefin ionomer having a polar group, a polyacryl, and polyvinyl alcohol; and from 1.5 g/m$^2$ to 15.0 g/m$^2$ of an inorganic pigment.

<2> The backsheet according to <1>, wherein the support comprises a polyester.

<3> The backsheet according to <1> or <2>, wherein the first polymer layer comprises the inorganic pigment in an amount of from 2.5 g/m$^2$ to 12.5 g/m$^2$, and the first polymer layer comprises the binder resin in an amount of from 1.0 g/m$^2$ to 12.5 g/m$^2$.

<4> The backsheet according to any one of <1> to <3>, wherein the inorganic pigment is a white pigment, a black pigment, or a blue pigment.

<5> The backsheet according to any one of <1> to <4>, wherein the first polymer layer comprises a structure portion derived from a crosslinking agent and wherein the first polymer layer comprises the structure portion in an amount of from 2% by mass to 30% by mass based on the total mass of the binder resin in the first polymer layer.

<6> The backsheet according to <5>, wherein the crosslinking agent is a carbodiimide crosslinking agent or an oxazoline crosslinking agent.

<7> The backsheet according to any one of <1> to <6>, wherein the backsheet comprises, between the support and the first polymer layer, a second polymer layer which comprises at least a polymer.

<8> The backsheet according to any one of <1> to <7>, wherein the backsheet has a ratio of an elongation at break after 50 hours of storage at 120° C. and 100% RH, to an elongation at break before the storage, of 50% or more.

<9> The backsheet according to any one of <1> to <8>, wherein the backsheet has a shrinkage of 0.5% or less after 30 minutes of storage at 150° C.

<10> The backsheet according to any one of <1> to <9>, wherein the first polymer layer has an adhesion to an encapsulant which encapsulates a photovoltaic element of 10 N/cm or more, and has an adhesion to the encapsulant after dump heat treatment at 120° C. and 100% RH of 5 N/cm or more.

<11> The backsheet according to any one of <1> to <10>, wherein the backsheet comprises, on a surface on an opposite side from the surface of the support on which the first polymer layer is disposed, a weatherproof layer which comprises at least one of a fluorinated resin or a silicone-acrylic composite resin.

<12> A solar cell module comprising: a photovoltaic element; an encapsulant which encapsulates the photovoltaic element; a top surface protection unit which is adhered to the encapsulant and which protects a light-receiving side; and a back surface protection unit which is adhered to the encapsulant and which protects an opposite side from the light-receiving side, wherein the back surface protection unit is the backsheet according to any one of <1> to <11>.

Effects of the Invention

The present invention can provide a solar cell backsheet which has good design or reflection and good adherence to an encapsulant and which is less likely to separate from an encapsulant after damp heat aging; and a solar cell module which can stably retain its electricity generation performance for a long time.

DESCRIPTION OF THE EMBODIMENTS

The embodiments of the present invention will be described hereinafter. The embodiments of the present invention described below are illustrative and not intended to limit the present invention.

The recitation of a numerical range by endpoints ("from m to n" or "m to n") includes the lower endpoint (m) as its minimum value and the upper endpoint (n) as its maximum value.

In a case in which plural materials which correspond to a certain component in a composition, an amount of the component specified in this description means the total amount of the plural materials which exist the component, unless otherwise defined.

The backsheet of the present disclosure includes: a support; and a first polymer layer which is formed on one side of the support and which includes: from 0.8 g/m² to 15.0 g/m² of a binder resin including at least one selected from the group consisting of a polyolefin ionomer having a polar group, a polyacryl, and polyvinyl alcohol; and from 1.5 g/m² to 15.0 g/m² of an inorganic pigment. The backsheet includes, on an outermost surface of one side of the support, the first polymer layer which includes the specified binder resin and the specified amount of the inorganic pigment. Thereby, the first polymer layer may function as a colored layer to provide good light reflection and/or design depending on a type of the inorganic pigment, and may also function as a readily adherable layer to show good adhesion to a cell body (especially adhesion to an EVA encapsulant which encapsulates a photovoltaic element) so that separation of the backsheet from an encapsulant after damp heat aging may be prevented to stably retaining the backsheet. Use of the backsheet for a solar cell may allow the electricity generation performance of the cell to be stably retained for a long time.

—Support—

The backsheet includes a support as a substrate. The support may or may not include a polyester. The polyester is a linear saturated polyester synthesized from an aromatic diacid or an ester formable-derivative thereof and a diol or an ester formable-derivative thereof. Specific examples of such polyester can include polyethylene terephthalate, polyethylene isophthalate, polybutylene terephthalate, poly(1,4-cyclohexylene dimethylene terephthalate), and polyethylene-2,6-naphthalate. Among them, polyethylene terephthalate and polyethylene-2,6-naphthalate are especially preferable in terms of the mechanical properties and cost balance.

The polyester may be a homopolymer or a copolymer.

The support may further include a small amount of another kind of resin such as a polyimide by blending the polyester therewith.

In a case in which the polyester is polymerized, it is preferable to use a Sb, Ge, or Ti compound as a catalyst so that the carboxyl group content does not exceed a specified range. Among them, the Ti compound is especially preferable. In a case in which the Ti compound is used, the Ti compound is used as a catalyst preferably at 1 ppm to 30 ppm, and more preferably at 3 ppm to 15 ppm, to polymerize the polyester. Use of the Ti compound in an amount within the above range may allow adjustment of the terminal carboxyl group content to the range specified below and may allow the polyester support to have a low hydrolysis resistance.

Examples of the process which can be used to synthesize the polyester using the Ti compound include those described in Japanese Examined Patent Publication No. 8-301198, Japanese Patent No. 2543624, Japanese Patent No. 3335683, Japanese Patent No. 3717380, Japanese Patent No. 3897756, Japanese Patent No. 3962226, Japanese Patent No. 3979866, Japanese Patent No. 3996871, Japanese Patent No. 4000867, Japanese Patent No. 4053837, Japanese Patent No. 4127119, Japanese Patent No. 4134710, Japanese Patent No. 4159154, Japanese Patent No. 4269704, Japanese Patent No. 4313538, and the like.

The content of the carboxyl group is preferably 50 eq./t or less, and more preferably 35 eq./t or less, based on the total mass of the polyester. The carboxyl group content of 50 eq./t or less may allow the hydrolysis resistance to be kept and strength loss due to damp heat aging to be decreased. The lower limit of the carboxyl group content is desirably 2 eq./t so as to retain adhesion between the polyester support and a layer formed on the surface of the support (for example, the first polymer layer).

The content of the carboxyl groups in the polyester can be adjusted depending on a type of the polymerization catalyst and the film-forming conditions such as the film-forming temperature and time.

The polyester which forms the support is preferably solid phase polymerized after polymerization. A preferable carboxyl group content can be achieved thereby. The solid phase polymerization may be carried out by a continuous process in which a tower is filled with a resin and then heated to gently reflux for a predetermined period of time, and the resultant is discharged from the tower, or a batch process in which a resin is placed into a reactor and heated for a predetermined period of time. In particular, methods described in Japanese Patent No. 2621563, Japanese Patent No. 3121876, Japanese Patent No. 3136774, Japanese Patent No. 3603585, Japanese Patent No. 3616522, Japanese Patent No. 3617340, Japanese Patent No. 3680523, Japanese Patent No. 3717392, Japanese Patent No. 4167159, and the like may be applied for the solid phase polymerization process.

The solid phase polymerization is carried out preferably at 170° C. to 240° C., more preferably at 180° C. to 230° C., and still more preferably at 190° C. to 220° C. And the solid phase polymerization is carried out preferably for 5 hours to 100 hours, more preferably for 10 hours to 75 hours, and still more preferably for 15 hours to 50 hours. The solid phase polymerization is carried out preferably under vacuum or nitrogen atmosphere.

In a case in which the support includes the polyester, the polyester support is preferably a biaxially stretched film former by, for example, melt-extruding the polyester described above to a film; cooling the film to solidify the film on a casting drum to form an unstretched film; longitudinally stretching the unstretched film one or more times at the Tg to the (Tg+60)° C. so that a stretch ratio becomes 3 times to 6 times in total; and transversely stretching the resultant film at the Tg to the (Tg+60)° C. so that a stretch ratio becomes 3 times to 5 times in total.

Further, the film may or may not be heat-treated at 180 to 230° C. for one second to 60 seconds, as required.

The support preferably has a thickness of about 25 to 300 μm, and more preferably 125 to 260 μm. If the support has a thickness of 25 μm or more, the support has good mechanical strength. If the support has a thickness of 300 μm or less, the support has cost advantages.

As thicker the polyester support is, the worse the hydrolysis resistance becomes so that the support tends not to withstand prolonged use. In one embodiment in which the polyester support has a thickness of 120 μm to 300 μm and the polyester has a carboxyl group content of 2 to 50 eq./t, the backsheet may have improved damp heat resistance.

—First Polymer Layer—

The first polymer layer includes: from 0.8 g/m² to 15.0 g/m² of a binder resin comprising at least one selected from a polyolefin ionomer having a polar group, a polyacryl, and polyvinyl alcohol; and from 1.5 g/m² to 15.0 g/m² of an inorganic pigment. The first polymer layer may or may not include another component such as a resin other than those described above and a variety of additives, as required.

A first function of the first polymer layer is reflection or decoration. For example, in a case in which the first polymer layer includes a white inorganic pigment, incident light which passes through a photovoltaic element (cell) without being used to generate power and reaches the backsheet is reflected by the first layer and then returns into the cell, which may improve the efficiency of power generation of the solar cell module. In a case in which, for example, the first polymer layer includes a blue or a black inorganic pigment, the appearance of the solar cell module viewed from the side on which solar light is incident (top surface side) may have improved decorativeness. In general, when a solar cell module is viewed from a top surface side (light receiving side), the backsheet is seen around the cells. The backsheet may thus improve the decorativeness and improve the appearance by having the first polymer layer.

(Inorganic Pigment)

The first polymer layer includes at least one inorganic pigment.

The inorganic pigment can be appropriately selected from, for example, titanium oxide, barium sulfate, silicon oxide, aluminum oxide, magnesium oxide, calcium carbonate, kaolin, talc, ultramarine blue, iron blue, carbon black, and the like to be included therein. For example, a white pigment can be used in consideration of improving the reflection, while a blue or black pigment can be used in consideration of improving design (decorativeness).

The first polymer layer includes the inorganic pigment in an amount of from 1.5 g/m² to 15.0 g/m². In a case in which the first polymer layer includes the inorganic pigment in an amount of from 1.5 g/m² or more, the layer may obtain required color to have adequate reflection or decorativeness. In a case in which the first polymer layer includes the inorganic pigment in an amount of 15.0 g/m² or less, the layer may have adequate adhesion to an encapsulant such as EVA and may have good surface properties, which may improve film strength.

In view of the foregoing, in one embodiment, the first polymer layer includes the inorganic pigment preferably in an amount of from 2.5 g/m² to 12.5 g/m², more preferably from 3.0 to 13.0 g/m², and still more preferably from 4.5 to 11.0 g/m².

An average volume particle size of the inorganic pigment is preferably 0.03 to 0.8 μm, and more preferably about 0.15 to 0.5 μm. In a case in which the average particle size is within the range, the light reflection efficiency may be improved. The average particle size is measured by LA-950 LASER DIFFRACTION PARTICLE SIZE DISTRIBUTION ANALYZER (trade name, manufactured by Horiba, Ltd.).

(Binder)

The first polymer layer includes a binder resin which contains at least one selected from a polyolefin ionomer having a polar group, a polyacryl, and polyvinyl alcohol (hereinafter sometimes referred to as "specific resin"). Due to the inclusion of the binder resin, the backsheet may be hardly hydrolyzed as compared with resins such as polyurethane and polyester so that degradation due to damp heat aging is reduced, thereby retaining adhesion to an encapsulant such as EVA for a long term even under harsh outdoor environment. Although the detailed cause of these effects is not known, the effects are presumably due to the fact that a main chain of the binder resin is hardly degraded even after damp heat aging.

The first polymer layer includes the binder resin in an amount of from 0.8 g/m² to 15.0 g/m², and preferably from 1.0 g/m² to 12.5 g/m². The first polymer layer includes the binder resin preferably in an amount of from 15 to 200% by mass, and more preferably from 17 to 100% by mass, based on the content of the inorganic pigment in the first polymer layer. In a case in which the first polymer layer includes the binder in an amount of 15% by mass or more, the backsheet has adequate strength. In a case in which the first polymer layer includes the binder in an amount of 200% by mass or less, the backsheet can have good reflectance and decorativeness.

The polyolefin ionomer having a polar group preferably has a polar group such as a carboxyl group. Examples thereof include CHEMIPEARL S75N (trade name, manufactured by Mitsui Chemicals, Inc.), ARROWBASE SE-1200 and ARROWBASE SB-1200 (trade names, manufactured by Unitica Ltd.), and HYTEC S-3111 and HYTEC S-3121 (trade names, manufactured by Toho Chemical Industry Co., Ltd.).

Examples of the polyacryl include JURYMER ET-410 and JURYMER SEK-301 (trade names, manufactured by Nihon Junyaku Co., Ltd.). A composite resin of acrylic and silicone is also preferable. Examples of the composite resin of acryl and silicone include CERANATE WSA-1060 and CERANATE WSA-1070 (trade names, manufactured by DIC Corp.) and POLYDUREX H-7620, POLYDUREX H-7630, and POLYDUREX H-7650 (all trade names, manufactured by Asahi Kasei Chemicals Corp.).

Examples of the polyvinyl alcohol (PVA) include those sold under the trade name of PVA-105, R-103, and R-205 by Kuraray Co., Ltd. A silanol-modified PVA is also preferable, and examples thereof include R-1130, R-2105, and R-2130 (trade names, manufactured by Kuraray Co., Ltd.).

In addition to the binder resin including at least one selected from a polyolefin ionomer having a polar group, a polyacryl, and polyvinyl alcohol, the first polymer layer may or may not include, as a binder, another polymer (hereinafter sometimes referred to as a "resin other than the specific resin") as required. Examples of the resin other than the specific resin include, for example, polyester, polyurethane, and the like. The resin other than the specific resin is added preferably in an amount of 30% by mass or less, and more preferably 20% by mass or less, based on the mass of all binders in the first polymer layer. When the addition amount of the resin other than the specific resin is 30% by mass of less based on all binders, troubles such as separation of the backsheet from an encapsulant due to damp heat aging may be prevented.

When the first polymer layer is formed, an additive such as still another resin, a crosslinking agent, a surfactant, or a filler may or may not be added as required, in addition to the inorganic pigment and the binder resin described above.

(Crosslinking Agent)

The first polymer layer preferably includes at least one crosslinking agent.

Examples of the crosslinking agent which is suitable for the first polymer layer include an epoxy crosslinking agent, an isocyanate crosslinking agent, a melamine crosslinking agent, a carbodiimide crosslinking agent, and an oxazoline crosslinking agent. Among them, the carbodiimide crosslinking agent or the oxazoline crosslinking agent are preferable, and the oxazoline crosslinking agent is especially preferable, in terms of adhesion after damp heat aging.

Specific examples of the carbodiimide crosslinking agent include CARBODILITE V-02-L2, CARBODILITE SV-02, CARBODILITE V-02, and CARBODILITE E-01 (trade names, manufactured by Nisshinbo Chemical Inc.).

Specific examples of the oxazoline crosslinking agent include 2-vinyl-2-oxazoline, 2-vinyl-4-methyl-2-oxazoline, 2-vinyl-5-methyl-2-oxazoline, 2-isopropenyl-2-oxazoline, 2-isopropenyl-4-methyl-2-oxazoline, 2-isopropenyl-5-ethyl-2-oxazoline, 2,2'-bis-(2-oxazoline), 2,2'-methylene-bis-(2-oxazoline), 2,2'-ethylene-bis-(2-oxazoline), 2,2'-trimethylene-bis-(2-oxazoline), 2,2'-tetramethylene-bis-(2-oxazoline), 2,2'-hexamethylene-bis-(2-oxazoline), 2,2'-octamethylene-bis-(2-oxazoline), 2,2'-ethylene-bis-(4,4'-dimethyl-2-oxazoline), 2,2'-p-phenylene-bis-(2-oxazoline), 2,2'-m-phenylene-bis-(2-oxazoline), 2,2'-m-phenylene-bis-(4,4'-dimethyl-2-oxazoline), bis-(2-oxazolinylcyclohexane) sulfide, and bis-(2-oxazolinyl norbornane) sulfide. Additionally, a (co)polymer of these compounds is also preferably used.

Examples of the compound having an oxazoline group which can be used further include EPOCROS® K-2010E, EPOCROS® K-2020E, EPOCROS® K-2030E, EPOCROS® WS-500, and EPOCROS® WS-700 (all trade names, manufactured by Nippon Shokubai Co., Ltd.).

When the crosslinking agent is added to a coating liquid for forming the first polymer layer, the crosslinking agent is preferably added in an amount of from 2 to 30% by mass based on the content of the binder resin in the coating liquid. When the crosslinking agent is added in an amount within the above range, a percentage of a mass of a structure portion derived from the crosslinking agent in the total mass of the binder resin in the first polymer layer becomes from 2% by mass to 30% by mass. More preferably, the crosslinking agent is added in an amount of from 5% by mass to 20% by mass. When the crosslinking agent is added in an amount within this range, the percentage becomes 5% by mass to 20% by mass. When the crosslinking agent is added in an amount of 2% by mass or more, the first polymer layer will obtain adequate crosslinking effects while retaining strength and adhesion. When the crosslinking agent is added in an amount of 30% by mass or less, aggregates may be hardly formed in a coating layer and the coating liquid may have a long pot life.

Examples of the surfactant include known surfactants such as an anionic surfactant and a nonionic surfactant. In a case in which the surfactant is added, the surfactant is preferably added in an amount of from 0.1 mg/m$^2$ to 15 mg/m$^2$ and more preferably from 0.5 mg/m$^2$ to 5 mg/m$^2$. Addition of the surfactant in an amount of 0.1 mg/m$^2$ or more may suppress occurrence of cissing and thus the first polymer layer may be successfully formed. Addition of the surfactant in an amount of 15 mg/m$^2$ or less may enable to favorably perform adhering.

(Fine Particles)

The first polymer layer may or may not include an inorganic fine particle which is other than the inorganic pigment.

Examples of the inorganic fine particle include silica, calcium carbonate, magnesium oxide, magnesium carbonate, and tin oxide. Among them, tin oxide and silica fine particles are preferable because tin oxide and silica exhibit a smaller degree of loss of adhesion after exposure to damp heat atmosphere.

A particle size of the inorganic fine particle is preferably about 10 to 700 nm, and more preferably about 20 to 300 nm, as an average volume particle size. In a case in which the fine particles have a particle size within the above range, the first polymer layer can have improved adherability. The particle size is a value measured by LA-950 LASER DIFFRACTION PARTICLE SIZE DISTRIBUTION ANALYZER (trade name, manufactured by Horiba, Ltd.).

A shape of the inorganic fine particle is not particularly limited and may be any form such as a spherical form, an irregular form, or a needle form.

A content of the inorganic fine particle in the first polymer layer is preferably from 5% by mass to 400% by mass based on the total mass of the binder resin in the first polymer layer. Inclusion of the inorganic fine particle in an amount of 5% by mass or more may allow good adhesion to be retained even after exposure to damp heat atmosphere. Inclusion of the inorganic fine particle in an amount of 400% by mass or less may allow the first polymer layer to have good surface properties.

Especially, the content of the inorganic fine particle may be preferably from 50% by mass to 300% by mass.

(Properties)

—Thickness—

A thickness of the first polymer layer is not particularly limited. Usually, the thickness is preferably in a range of 0.05 to 8 µm, and more preferably in a range of 0.1 to 5 µm. When the thickness of the first polymer layer is 0.05 µm or more, reflection or design may be suitably obtained, and required adherability may be suitably obtained. When the thickness of the first polymer layer is 8 µm or less, improved surface properties may be obtained.

—Adhesion—

Inclusion in the first polymer layer of the at least one binder resin selected from a polyolefin ionomer having a polar group, a polyacryl, and polyvinyl alcohol; and 2.5 to 14.0 g/m$^2$ of the inorganic pigment may allow the first polymer layer to have an adhesion to an encapsulant such as EVA which encapsulates a photovoltaic element 10 N/cm or more (preferably 20 N/cm or more) and may allow the first polymer layer subjected to damp heat treatment at 120° C. and 100% RH to have an adhesion to an encapsulant of 5 N/cm or more. A surface of the backsheet to be adhered to an encapsulant (the first polymer layer) may or may not be subjected to corona treatment. When the first polymer layer is subjected to the corona treatment, the adhesion may be further improved.

—Reflectance—

In a case in which a white pigment as the inorganic pigment is added to the first polymer layer to form a reflection layer, a surface of the backsheet at which the first polymer layer is provided with preferably has a light reflectance at 550 nm of 75% or more. The light reflectance refers to a ratio of the total amount of light reflected by, among surfaces of the backsheet, the reflection layer to the total amount of light incident on the backsheet surface which has the first polymer layer (reflection layer side).

In a case in which the first polymer layer which has a light reflectance of 75% or more, the first polymer layer can effectively return, to the cell, light which passes through the cell and enters an interior, and thus the first layer may provide improved efficiency of power generation. The light reflectance may be regulated to 75% or more by regulating the content of the inorganic pigment in the first polymer layer to be in a range of 2.5 to 14.0 g/m$^2$.

In a case in which the first polymer layer is configured as a reflection layer, the reflection layer preferably has a thickness of 1 to 20 μm and more preferably about 1.5 to 10 μm. In a case in which the reflection layer has a thickness of 1 μm or more, the backsheet may have required decorativeness and reflectance. In a case in which the reflection layer has a thickness of 20 μm or less, the backsheet may keep good surface properties.

(Method for Forming First Polymer Layer)

The first polymer layer can be formed by coating a coating liquid for forming the first polymer layer directly or via a second polymer layer described below to the support.

When a backsheet is formed In a conventional process of by sticking resin films which include an inorganic pigment and the like via an adhesive such as urethane and polyester as conventionally done, the resultant backsheet may be thicker and the adhesive is more likely to hydrolyze and degrade due to prolonged use. Thus such backsheet is more likely to separate from an encapsulant. On the other hand, the process of forming the first polymer layer by coating as in this embodiment is simpler, allows formation of a uniform thin film, and hardly causes separation.

Examples of a coating method include known coating processes such as gravure coating and bar coating.

The coating liquid may be an aqueous one that includes water as the solvent or may be a solvent-based one that includes an organic solvent such as toluene or methylethylketone. Especially, the coating liquid preferably includes water as the solvent in terms of environmental burden. The solvent for the coating liquid may be used individually, or two or more of the solvents may be used in combination.

—Second Polymer Layer—

The backsheet may or may not include, between the support and the first polymer layer, a second polymer layer which includes at least a polymer (binder resin). Examples of the second polymer layer include a primer layer which may improve adhesion between the first polymer layer and the support.

Examples of the binder which can be used for such primer layer include a polyester resin, a polyurethane resin, an acrylic resin, a polyolefin resin, and a silicone resin. Among them, a carboxylic group containing polyester resin and an acrylic silicone resin are especially preferable in terms of adhesion.

(Other Additives)

A crosslinking agent, a surfactant, a filler, and/or the like may or may not be added to the primer layer, as required.

(Crosslinking Agent)

Examples of the crosslinking agent include an epoxy crosslinking agent, an isocyanate crosslinking agent, a melamine crosslinking agent, a carbodiimide crosslinking agent, and an oxazoline crosslinking agent. Among them, the carbodiimide crosslinking agent and the oxazoline crosslinking agent are preferable. Specific examples of the carbodiimide crosslinking agent include CARBODILITE V-02-L2 (trade name, manufactured by Nisshinbo Chemical Inc.). Specific examples of the oxazoline crosslinking agent include EPOCROS® WS-700 and EPOCROS® K-2020E manufactured by Nippon Shokubai Co., Ltd.

The crosslinking agent is preferably added in an amount of from 0.5% by mass to 25% by mass, and more preferably from 2% by mass to 20% by mass, based on the binder which forms the primer layer. In a case in which the crosslinking agent is added in an amount of 0.5% by mass or more, the primer layer can have an adequate crosslinking effect while retaining strength and adhesion. In a case in which the crosslinking agent is added in an amount of 25% by mass or less, the coating liquid can have a long pot life.

(Surfactant)

Examples of the surfactant which can be used include known surfactants such as anion surfactants and nonionic surfactants. When the surfactant is added, an addition amount thereof is preferably from 0.1 to 10 mg/m$^2$, and more preferably from 0.5 to 3 mg/m$^2$. When the addition amount of the surfactant is 0.1 mg/m$^2$ or more occurrence of cissing may be suppressed and thus the first polymer layer may be successfully formed. Addition of the surfactant in an amount of 10 mg/m$^2$ or less may allow good adhesion between the support and the first polymer layer.

(Filler)

Examples of the filler which can be used include known fillers such as colloidal silica and titanium dioxide.

The filler is preferably added in an amount of 20% by mass or less, and more preferably 15% by mass or less, based on the binder resin in the primer layer. In a case in which the filler is added in an amount of 20% by mass or less, the primer layer can have better surface properties.

(Thickness)

The primer layer has a thickness of 0.05 to 10 μm. The primer layer which has a thickness within the range of 0.05 to 10 μm may provide both of good resistance and good surface properties at once, thereby improving adhesion between the support and the first polymer layer. The thickness of about 1.0 to 10 μm is especially preferable.

(Method for Forming Primer Layer)

The primer layer can be formed by coating, on the support, a coating liquid which includes a binder and the like and then drying the coating liquid. After drying, the coating liquid may be cured by heating or the like. The coating process and the solvent for the coating liquid are not particularly limited.

Examples of the coating process which can be used include gravure coating and bar coating.

The solvent used for the coating liquid may be water or an organic solvent such as toluene and methylethylketone. The solvent may be used individually, or one or two of the solvents may be used in combination. In one embodiment, it is preferable to form an aqueous coating liquid in which a binder is dispersed in an aqueous solvent and apply the aqueous coating liquid to the support. In this case, a percentage of water in the solvent is preferably 60% by mass or more, and more preferably 80% by mass or more.

In a case in which the support is a biaxially stretched film, the coating liquid for forming the primer layer may be applied to the biaxially stretched support and then dried. Alternatively, the coating liquid may be applied to a uniaxially stretched support and then dried; and then the resultant support may be stretched in a direction different from the direction in the uniaxial stretching process. The coating liquid may also be applied to the support before stretching and then dried; and then the resultant support may be biaxially stretched.

—Weatherproof Layer—

Preferably, the backsheet further includes, on a surface on an opposite side from the surface of the support on which the first polymer layer is provided, a weatherproof layer which includes at least one of a fluorinated resin or a silicone-acrylic composite resin.

Examples of the fluorinated resin which is included in a coating liquid for forming the weatherproof layer include chlorotrifluoroethylene, tetrafluoroethylene, hexafluoropropylene, vinylidene fluoride, trifluoroethylene, a chlorotrifluoroethylene-ethylene copolymer, and a tetrafluoroethylene-perfluoroalkylvinylether copolymer. Among them, in terms of solubility and weatherability, a chlorotrifluoroethylene-vinylether copolymer, in which a vinyl compound is copolymerized, is preferable.

The coating liquid for forming the weatherproof layer preferably includes the fluorinated resin in an amount of from 40% by mass to 90% by mass, and more preferably from 50% by mass to 80% by mass, based on the total solid content of the coating liquid, in terms of weatherability and film strength.

Examples of the composite resin of silicone and acryl which is included in the coating liquid for forming the weatherproof layer include CERANATE WSA-1060 and CERANATE WSA-1070 (both trade names, manufactured by DIC Corp.) and POLYDUREX H-7620, POLYDUREX H-7630, and POLYDUREX H-7650 (all trade names, manufactured by Asahi Kasei Chemicals Corp.).

The coating liquid for forming the weatherproof layer preferably includes the composite resin of silicone and acryl in an amount of from 40% by mass to 90% by mass, and more preferably from 50% by mass to 80% by mass, based on the total solid content of the coating liquid in terms of weatherability and film strength.

The coating liquid for forming the weatherproof layer is preferably applied in an amount of from 0.05 $g/m^2$ to 30 $g/m^2$, and more preferably from 1 $g/m^2$ to 20 $g/m^2$, in terms of weatherability and adhesiveness to the support.

The process for applying the coating liquid for forming the weatherproof layer is not particularly limited.

Examples of the application process which can be used include gravure coating and bar coating.

The solvent for the coating liquid for forming the weatherproof layer is preferably water. The solvent which is included in the coating liquid for forming the weatherproof layer preferably includes water in an amount of 60% by mass or more. An aqueous coating liquid is preferable since it may less likely cause environmental burden. The percentage of water in an amount of 60% by mass or more may be advantageous in terms of explosion proofness and safety.

The percentage of water in the coating liquid for forming the weatherproof layer is more preferably larger in terms of environmental burden. The water is more preferably included in an amount of 70% by mass or more based on the total mass of the solvent.

The weatherproof layer may include various additives such as the inorganic oxide filler described above, a fine particle other than the inorganic oxide filler, a UV light absorber, an antioxidant, and a surfactant.

A layer thickness of the weatherproof layer is preferably 0.3 μm to 15.0 μm, and more preferably 0.5 μm to 12.0 μm. The weatherproof layer which has a layer thickness of 0.3 μm or more can obtain sufficient weatherability, while the weatherproof layer which has a layer thickness of 15.0 μm or less can supress deterioration of the surface properties.

The weatherproof layer may be a monolayer or a multilayer formed by layering two or more layers.

—Production of Backsheet—

As described above, the backsheet can be suitably produced by, forming the primer layer (second polymer layer) on the support as required, forming the first polymer layer over the support by coating.

The coating liquid for forming the first polymer layer includes 2.5 to 14.0 $g/m^2$ of the inorganic pigment and the binder resin. The details on the components which constitute the coating liquid and the amount ranges are described above.

The suitable coating process is also described above, and examples of the process that can be used include gravure coating and bar coating.

Preferably, the coating liquid for forming the first polymer layer is an aqueous coating liquid which includes water in an amount of 60% by mass or more based on the total mass of the solvent. An aqueous coating liquid is preferable in terms of environmental burden. Inclusion of water in an amount of 60% by mass or more significantly reducte environmental burden.

Desirably, the coating liquid for forming the first polymer layer includes more water in terms of environmental burden. More preferably, water is included in an amount of 90% by mass or more based on the total mass of the solvent.

The coating liquid for forming the first polymer layer can be applied directly or preferably via the primer layer (second polymer layer) having a thickness of 2 μm or less to the surface of the support to form the first polymer layer.

(Thermal Shrinkage)

In one embodiment, the backsheet may have a shrinkage of 0.5% or less after 30 minutes of storage at 150° C.

In general, polyester has a larger thermal expansion coefficient and a larger hygroscopic expansion coefficient compared to glass. Thus the polyester is susceptible to stress due to temperature and humidity changes and tends to cause cracking and delamination of a layer. The backsheet which has a thermal shrinkage within the above range may effectively prevent cracking due to long term aging and separation of layers formed by coating from the support or the like.

The thermal shrinkage can be adjusted within the above range by, for example, heat treating a polymer sheet, which is formed as the support, at a temperature of about 80° C. to 200° C.

(Elongation at Break)

The support preferably has a ratio of elongation at break after 50 hours of storage at 120° C. and 100% RH, to elongation at break before the storage (hereinafter also referred to as a "retention of elongation at break"), of 50% or more. In a case in which the support which has a retention of elongation at break of 50% or more, changes which are accompanied with hydrolysis may be suppressed, and adherence at the interface with an encapsulant in long term use may be stably retained, so that separation of, the backsheet from an encapsulant after aging and the like may be prevented. This allows, for example, the backsheet to exhibit high durability even under high temperature and high humidity environment such as outdoor environment and/or under exposure to light for a long time.

The retention of elongation at break is a value determined based on an elongation at break measured for the backsheet which includes the support and the first polymer layer, (and optionally, another layer such as the second polymer layer as required).

The backsheet more preferably has a retention of elongation at break of 60% or more, and still more preferably 70% or more, for the above reasons.

<Solar Cell Module>

The solar cell module of the present disclosure includes the backsheet described above.

In one embodiment, the module includes a photovoltaic element, an encapsulant which encapsulates the photovoltaic element, a top surface protection unit which is adhered to the encapsulant and which protects a light-receiving side, and a back surface protection unit which is adhered to the encapsulant and which protects the opposite side from the light-receiving side, the back surface protection unit being the backsheet described above. More specifically, for example, the photovoltaic element which converts solar light energy into electrical energy is disposed between a transparent substrate (the surface protection unit) which receives solar light and the backsheet described above (the back surface protection unit), and the encapsulant, preferably ethylene-vinyl acetate (EVA) encapsulant, is used to encapsulate a space between the substrate and the backsheet.

The solar cell module, the photovoltaic element (cell), and components other than the backsheet are detailed in, for example, "Taiyoh-ko Hatsuden Shistem Kohsei Zairyo" edited by Eiich Sugimoto (Kogyo Chosakai Publishing Co., Ltd., 2008).

The transparent substrate may be any substrate as long as the substrate can transmit solar light. The higher the light transmission of the substrate, the more preferable in terms of efficiency of power generation. Examples of such substrate which can be suitably used include a glass substrate and a transparent resin such as an acrylic resin.

Examples of the photovoltaic element which can be used include a variety of known photovoltaic elements including those based on silicons such as monocrystalline silicon, multicrystalline silicon, and amorphous silicon, and semiconductors based on Group III-V or II-VI compound such as copper-indium-gallium-selenium, copper-indium-selenium, cadmium-tellurium, and gallium-arsenic.

EXAMPLES

The present invention will be more specifically described with reference to Examples hereinafter, although the present invention is not intended to be limited thereto as long as the spirit of the present invention is not departed. Unless otherwise specified, "part" is based on mass. Unless otherwise specified, average volume particle sizes are measured by LA-950 LASER DIFFRACTION PARTICLE SIZE DISTRIBUTION ANALYZER (trade name, manufactured by Horiba, Ltd.).

Example 1

—Production of Polyester Support—
<Synthesis of Polyester>

A slurry formed of 100 kg of high purity terephthalic acid (manufactured by Mitsui Chemicals, Inc.) and 45 kg of ethylene glycol (manufactured by Nippon Shokubai Co., Ltd.) was sequentially fed, over a period of 4 hours, into an esterification reactor, in which about 123 kg of bis(hydroxyethyl) terephthalate was introduced in advance and which was kept at a temperature of 250° C. and a pressure of $1.2 \times 10^5$ Pa. After the feeding was completed, the esterification reaction was continued for an hour. Then 123 kg of the resulting esterification product was transferred to a polycondensation reactor.

To the polycondensation reactor to which the esterification product was transferred, ethylene glycol was added in an amount of 0.3% by mass based on the polymer to be produced. After stirring for 5 minutes, an ethylene glycol solution of cobalt acetate and an ethylene glycol solution of manganese acetate were added so as to be 30 ppm and 15 ppm respectively based on the polymer to be produced. After stirring for 5 minutes, a 2% by mass solution of a titanium alkoxide compound in ethylene glycol was added in an amount of 5 ppm based on the polymer to be produced. The titanium alkoxide compound is the compound which is synthesized as described in Example 1 in the paragraph [0083] of JP-A No. 2005-340616, and the compound had a Ti content of 4.44% by mass. After 5 minutes of the addition, a 10% by mass solution of ethyl diethylphosphonoacetate in ethylene glycol was added in an amount of 5 ppm based on the polymer to be produced.

The resultant low polymer and the reaction system were gradually heated from 250° C. to 285° C. with stirring at 30 rpm, while the pressure was reduced to 40 Pa. A time to reach the final temperature and the final pressure was set to 60 minutes. The reaction was continued for additional 3 hours and then the reaction system was purged with nitrogen and returned to atmospheric pressure to halt the polycondensation reaction. Then the resulting polymer melt was extruded into cold water to be in a strand shape. Immediately thereafter, the strands were chopped into polymer pellets having a diameter of about 3 mm and a length of about 7 mm.

<Solid Phase Polymerization>

The pellets obtained as described above were placed in a vacuum chamber held at 40 Pa at a temperature of 220° C. for 30 hours to perform solid phase polymerization.

<Formation of Base>

The solid phase polymerized pellets were melted at 280° C. and cast on a metal drum to form an unstretched base having a thickness of about 2.5 mm The unstretched base was stretched three times in the longitudinal direction at 90° C. and then stretched 3.3 times in the transverse direction at 120° C. The transversely stretched base was heat-set at 215° C. for one minute, thereby giving a support, which is a biaxially stretched polyethylene terephthalate having a thickness of 250 μm (hereinafter sometimes referred to as a "support"). biaxially stretched Besides, a biaxially stretched polyethylene terephthalate support (PET substrate) having a thickness of 125 μm, a PET substrate having a thickness of 188 μm, and a PET substrate having a thickness of 300 μm, were obtained in the similar manner as the above process, except that the thicknesses of the unstretched bases therefor were varied.

<Primer Layer>
—Preparation of Coating liquid for Forming Primer Layer—

The following ingredients were mixed to prepare the coating liquid for forming the primer layer.
(Ingredients of Coating Liquid)

| | |
|---|---|
| Polyester binder (VYLONAL DM-1245 ®, manufactured by Toyobo Co., Ltd., solid content: 30%) | 48.0 parts by mass |

-continued

| | |
|---|---|
| Carbodiimide compound (crosslinking agent) (Trade name: CARBODILITE V-02-L2, manufactured by Nisshinbo Chemical Inc., solid content: 10% by mass) | 10.0 parts by mass |
| Oxazoline compound (crosslinking agent) (EPOCROS ® WS-700, manufactured by Nippon Shokubai Co., Ltd., solid content: 25% by mass) | 3.0 parts by mass |
| Surfactant (Trade name: NAROACTY CL-95, manufactured by Sanyo Chemical Industries, Ltd.), solid content: 1% by mass | 15.0 parts by mass |
| Distilled water | 907.0 parts by mass |

—Formation of Primer Layer—

The resultant coating liquid for forming the primer layer was applied to one side of the PET substrates in an amount to provide 0.1 g/m² of the binder and then dried at 180° C. for a minute to form a primer layer having a dry thickness of about 0.1 μm.

<Colored Layer>

—Preparation of Titanium Dioxide Dispersion—

The following ingredients were mixed, and the mixture was dispersed in a Dynomill bead mill for an hour.

(Ingredients of Titanium Dioxide Dispersion)

| | |
|---|---|
| Titanium dioxide having an average volume particle size of 0.42 μm (Trade name: TIPAQUE R-780-2, manufactured by Ishihara Sangyo Kaisha, Ltd., solid content: 100% by mass) | 39.9% by mass |
| Polyvinyl alcohol (Trade name: PVA-105, manufactured by Kuraray Co., Ltd., solid content: 10% by mass) | 49.9% by mass |
| Surfactant (Trade name: DEMOL EP, manufactured by Kao Corp., solid content: 10% by mass) | 0.5% by mass |
| Distilled water | 9.7% by mass |

—Preparation of Coating liquid for Forming the Colored Layer—

The following ingredients were mixed to prepare the coating liquid for forming the colored layer.

(Ingredients of Coating Liquid)

| | |
|---|---|
| Titanium dioxide dispersion | 80.0% by mass |
| Silanol-modified polyvinyl alcohol binder (P-1) (Trade name: R-1130, manufactured by Kuraray Co., Ltd., solid content: 7% by mass) | 11.4% by mass |
| Polyoxyalkylene alkylether (Trade name: NAROACTY CL-95, manufactured by Sanyo Chemical Industries, Ltd., solid content: 1% by mass) | 3.0% by mass |
| Oxazoline compound (EPOCROS ® WS-700, manufactured by Nippon Shokubai Co., Ltd; crosslinking agent, solid content: 25%) | 2.0% by mass |
| Distilled water | 3.6% by mass |

—Formation of Colored Layer (First Polymer Layer)—

The resultant coating liquid was applied to one side of the biaxially stretched PET substrates described above and then dried at 180° C. for one minute to form a colored layer which had a titanium dioxide content of 7.0 g/m² and a binder content of 1.2 g/m².

<Back Primer Layer>

—Preparation of Pigment Dispersion—

The following ingredients were mixed, and the mixture was dispersed in a Dynomill bead mill for an hour.

(Ingredients of Pigment Dispersion)

| | |
|---|---|
| Titanium dioxide having an average volume particle size of 0.42 μm (Trade name: TIPAQUE R-780-2, manufactured by Ishihara Sangyo Kaisha, Ltd., solid content: 100% by mass) | 40% by mass |
| Aqueous polyvinyl alcohol solution (10% by mass) (Trade name: PVA-105 from Kuraray Co., Ltd.) | 20.0% by mass |
| Surfactant (Trade name: DEMOL EP, manufactured by Kao Corp., solid content: 25% by mass) | 0.5% by mass |
| Distilled water | 39.5% by mass |

—Preparation of Coating Liquid for Forming Back Primer Layer—

The following ingredients were mixed to prepare the coating liquid for forming the primer layer.

(Ingredients of Coating Liquid)

| | |
|---|---|
| Acrylic/silicone binder (binder) (Trade name: CERANATE WSA-1070, manufactured by DIC Corp., solid content: 40% by mass) | 362.3 parts by mass |
| Carbodiimide compound (crosslinking agent) (Trade name: CARBODILITE V-02-L2, manufactured by Nisshinbo Chemical Inc., solid content: 40% by mass) | 48.3 parts by mass |
| Surfactant (Trade name: NAROACTY CL-95, manufactured by Sanyo Chemical Industries, Ltd., solid content: 1% by mass) | 9.7 parts by mass |
| Pigment dispersion described above | 157.0 parts by mass |
| Distilled water | 422.7 parts by mass |

—Formation of Back Primer Layer—

The resultant coating liquid for forming the primer layer was applied to the support at the opposite surface from the surface provided with the white layer, in an amount to provide 3.0 g/m² of the binder, and then dried at 180° C. for one minute to form a primer layer having a dry thickness of about 3 μm.

<Back Polymer Layer>

—Preparation of Coating Liquid for Forming Back Polymer Layer—

The following ingredients were mixed to prepare the coating liquid for forming a back polymer layer.

(Ingredients of Coating Liquid)

| | |
|---|---|
| Acrylic/silicone binder (binder) (Trade name: CERANATE WSA-1070, manufactured by DIC Corp., solid content: 40% by mass) | 362.3 parts by mass |
| Carbodiimide compound (crosslinking agent) (CARBODILITE V-02-L2, manufactured by Nisshinbo Chemical Inc., solid content: 40% by mass) | 24.2 parts by mass |
| Surfactant (Trade name: NAROACTY CL-95, manufactured by Sanyo Chemical Industries, Ltd., solid content: 1% by mass) | 24.2 parts by mass |
| Distilled water | 703.8 parts by mass |

—Formation of Back Polymer Layer—

The resultant coating liquid for forming the back polymer layer is applied onto the back primer layer, in an amount to provide 2.0 g/m² of the binder and then dried at 180° C. for one minute to form a polymer layer having a dry thickness of about 2 μm.

As described above, the layers are formed by application to respective sides of the PET substrates to produce backsheet samples. These samples were evaluated as described below. The results are shown in Table 1.

<Evaluation>

—1. Adhesion—

[A] Adhesion Before Damp Heat Aging (Fr)

A sample sheet produced as described above was cut to prepare two sample pieces having a width of 20 mm and a length of 150 mm.

The two sample pieces were placed so that the colored layers (first polymer layers) thereof were disposed inside, and an EVA sheet which had a width of 20 mm and a length of 100 mm (trade name: SC 50-B, manufactured by Mitsui Chemicals Fabro, Inc.) was interposed between the sample pieces. Because the length of the sample pieces was different length from the length of the EVA sheet, the resultant laminate sample did not include the EVA sheet in the area ranging from a terminus of the sample to a portion which is 50 mm-inside apart from the terminus The layered sample was hot-pressed in a vacuum laminator (manufactured by Nisshinbo Mechatronics Inc.) to bond the EVA sheet with the first polymer layers of the sample pieces. The bonding conditions are described below.

After vacuuming at 128° C. for 3 minutes in the vacuum laminator, pressure was applied for 2 minutes to temporarily bond the layers. Then the layers were fully bonded in a dry oven at 150° C. for 30 minutes. The resultant sample for evaluating adhesion, which had the two sample pieces which were bonded to one another and between which the EVA sheet was disposed in the area except for either end area ranging from a terminus of the sample to a portion which is 50 mm-apart from the terminus, was thus obtained.

The area with no EVA sheet in the resultant sample for evaluating adhesion was clamped in jaws of a universal testing machine (trade name: TENSILON RTC-1210A, manufactured by Orientec Co., Ltd.) and was subjected to tensile shear testing at a separation angle of 180° and a tensile speed of 300 mm/min The measured tensile shear bond strength was used as an indicator of the adhesion.

The adhesion was evaluated in accordance with the following criterion. The grades 4 and 5 indicate as being in a practically acceptablerange.

<Evaluation Criterion>

5: Very good adhesion (20 N/10 mm or more)
4: Good adhesion (at least 10 N/10 mm and less than 20 N/10 mm)
3: Poor adhesion (at least 5 N/10 mm and less than 10 N/10 mm)
2: Adhesive failure (at least 3 N/10 mm and less than 5 N/10 mm)
1: Severe adhesive failure (less than 3 N/10 mm)

[B] Adhesion After Damp Heat Aging (PC)

After keeping the resultant sample for evaluating adhesion at 120° C. and 100% RH for 48 hours (damp heat aging), the adhesion of the sample was measured in the same manner as the manner described in [A]. A ratio of the adhesion measured after the aging to the adhesion of the same sample before the damp heat aging measured as described in [A] was calculated in percent (adhesion after damp heat aging/adhesion before damp heat aging×100). And the adhesion measured after damp heat aging was evaluated in the same manner as the manner described in [A].

—2. Retention of Elongation at Break—

The retention of elongation at break (%) of the resultant sample was calculated using the following equality, based on the elongation at break values $L^0$ and $L^1$ measured in accordance with the following method. 50% or more of retention of elongation at break indicates a practically acceptable level.

Retention of Elongation at Break (%)=$(L^1/L^0)$×100

(Method for Measuring Elongation at Break)

The samples was cut into pieces having a width of 10 mm and a length of 200 mm to prepare sample pieces A and B for the measurement.

The sample piece A was conditioned at 25° C. and 60% RH for 24 hours and then subjected to tensile testing using a universal testing machine (trade name: TENSILON RTC-1210A, manufactured by Orientec Co., Ltd.). The test was performed by clamping the sample at either end area ranging from a terminus of the sample to a portion which is 50 mm-inside apart from the terminusso as to set a length of an area to be extended to 100 mm The tensile speed was 20 mm/min The resultant elongation at break of the sample piece A was recorded as $L^0$.

The sample piece B was subjected to damp heat treatment at 120° C. and 100% RH for 50 hours, and then subjected to tensile testing in the same manner as the manner for the sample piece A. The resultant elongation at break of the sample piece B was recorded as $L^1$.

—3. Thermal Shrinkage—

The sample was conditioned at 25° C. and 60% RH for 24 hours. Then a razor was used to scrape the surface of the sample to draw two parallel lines at a distance of about 30 cm, and the distance was measured as $G^0$. Then the sample was heat-treated at 150° C. for 30 minutes. The heat-treated sample was conditioned at 25° C. and 60% RH for 24 hours, and then the distance between the lines was measured as $G^1$.

The shrinkage was calculated using the following equality. The shrinkage was measured in the longitudinal direction and the transverse direction of the sample, and the average of the measurements was recorded as the shrinkage of the sample. The shrinkage was recorded in percent. The positive values indicate expansion, while the negative values indicate shrinkage.

Shrinkage=$[(G^1-G^0)/G^0]$×100

Examples 2 and 3

Examples 2 and 3 were performed in the same manner as in Example 1 except that the inorganic pigment in Example 1 was changed to ultramarine blue or carbon black.

The ultramarine blue dispersion and the carbon black dispersion were produced in the following manner.

<Blue Layer>

—Preparation of Ultramarine Blue Dispersion—

The following ingredients were mixed, and the mixture was dispersed in a Dynomill bead mill for an hour.

(Ingredients of Ultramarine Blue Dispersion)

| | |
|---|---|
| Ultramarine blue (Trade name: ULTRAMARINE BLUE NUBIFLOW, manufactured by Ozeki Co., Ltd.) | 39.9% by mass |
| Polyvinyl alcohol (Trade name: PVA-105, manufactured by Kuraray Co., Ltd., solid content: 10%) | 8.0% by mass |
| Surfactant (Trade name: DEMOL EP, manufactured by Kao Corp., solid content: 25%) | 0.5% by mass |
| Distilled water | 51.6% by mass |

<Black Layer>

—Preparation of Carbon Black Dispersion—

The following ingredients were mixed, and the mixture was dispersed in a Dynomill bead mill for an hour.

(Ingredients of Carbon Black Dispersion)

| | |
|---|---|
| Carbon black (Trade name: TOKABLACK #8500F, manufactured by Tokai Carbon Co., Ltd. | 39.9% by mass |
| Polyvinyl alcohol (Trade name: PVA-105, manufactured by Kuraray Co., Ltd., solid content: 10%) | 8.0% by mass |
| Surfactant (Trade name: DEMOL EP, manufactured by Kao Corp., solid content: 25%) | 0.5% by mass |
| Distilled water | 51.6% by mass |

The resultant sample pieces were evaluated in the same manner as the manner in Example 1. The results are shown in Table 1.

Examples 5, 6, and 7, and Comparative Examples 1 and 2

Example 5, 6, and 7 and Comparative Examples 1 and 2 were performed in the same manner as the manner in Example 1 except that the binder for the colored layer was changed as shown in Table 1. The resultant sample pieces were evaluated in the same manner as the manner in Example 1. The results are shown in Table 1.

Example 8

The evaluation was performed in the same manner as the manner in Example 1 except that the primer layer was not disposed on the side on which the colored layer was formed. The results are shown in Table 1.

Examples 9 to 12

Examples 9 to 12 were performed in the same manner as the manner in Example 1 except that the crosslinking agent for the colored layer was changed as shown in Table 1. The resultant sample pieces were evaluated in the same manner as the manner in Example 1. The results are shown in Table 1.

Examples 13, 15, and 16, and Comparative Examples 3 and 4

Example 13, 15, and 16 and Comparative Examples 3 and 4 were performed in the same manner as the manner in Example 1 except that the amount of the inorganic pigment added for the colored layer was changed as shown in Table 1. The resultant sample pieces were evaluated in the same manner as the manner in Example 1. The results are shown in Table 1.

Examples 17 and 19 to 22

Example 17 and 19 to 22 were performed in the same manner as the manner in Example 1 except that the amount of the binder added for the colored layer was changed as shown in Table 1. The resultant sample pieces were evaluated in the same manner as the manner in Example 1. The results are shown in Table 1.

Example 23

The support was formed in the same manner as the manner in Example 1 except that the solid phase polymerization was not conducted and that the base was heat-set at 235° C. instead of 215° C. Except that this support was used, Example 23 was performed in the same manner as the manner in Example 1. The resultant sample pieces were evaluated in the same manner as the manner in Example 1. The results are shown in Table 1.

Comparative Example 5

A white PET film having a thickness of 50 µm (polyethylene terephthalate base having a titanium dioxide content of 12% by mass (substrate 1)) and a transparent PET film having a thickness of 188 µm (polyethylene terephthalate base with no titanium dioxide (substrate 2)) were laminated under the following conditions to prepare a backsheet.

<Sticking Process>

An adhesive prepared by mixing LX-660 (K) (trade name, manufactured by DIC Corp.) with 10 parts of a curing agent (trade name, manufactured by KW-75 by DIC Corp.) was used to bond the substrate 2 to the substrate 1 by hot pressing with a vacuum laminator (vacuum lamination machine manufactured by Nisshinbo Mechatronics Inc.).

A vacuum was drawn at 80° C. for 3 minutes, and pressure was applied for 2 minutes to bond the substrates. The bonded substrates were then held at 40° C. for 4 days to complete the reaction.

The surface of the white PET was subjected to corona discharge treatment at 50 Hz and 1 kl/m$^2$. The resultant sample was then evaluated in the same manner as the manner in Example 1. The results are shown in Table 1.

Examples 24 to 29

Examples 24 to 29 were performed in the same manner as the manner in Example 1 except that the amount of the oxazoline compound (crosslinking agent) added for the colored layer was changed as shown in Table 1. The resultant samples were evaluated in the same manner as the manner in Example 1. The results are shown in Table 1.

Example 30

<Production of Solar Cell Module>

A reinforced glass sheet having a thickness of 3.2 mm, an EVA sheet (trade name: SC 50B, manufactured by Mitsui Chemicals Fabro, Inc.), a crystalline photovoltaic element (cell), an EVA sheet (trade name: SC 50B, manufactured by Mitsui Chemicals Fabro, Inc.), and the backsheet 1 in Example 1 were layered in this order, and the layers in the resultant were bonded together by hot pressing in a vacuum laminator manufactured by Nisshinbo Mechatronics Inc. Note that the backsheet was disposed to contact the readily adherable layer (colored layer) with the EVA sheet. The following bonding conditions were used.

A vacuum was drawn at 128° C. for 3 minutes with the vacuum laminator, and pressure was applied for 2 minutes to temporarily bond the layers. Then the bonded layers were fully bonded in a dry oven at 150° C. for 30 minutes.

In this way, a crystalline solar cell module 1 was produced. In place of the backsheet 1, the backsheets 2 to 29 was used to produce crystalline solar cell modules 2 to 29 respectively.

When the produced solar cell modules 1 to 29 were used to generate electric power, all of the solar cells exhibited good electricity generation performance.

TABLE 1

| Sample | Support Thickness | Support Retention of Elongation at Break | Colored Layer Type of Pigment | Colored Layer Amount of Pigment | Colored Layer Type of Binder | Colored Layer Amount of Binder | Colored Layer Type of Crosslinking Agent | Colored Layer Amount of Crosslinking Agent | Primer Layer | Evaluation Result Adhesion to Encapsulant (Fr) | Evaluation Result Adhesion to Encapsulant (PC) | Thermal Shrinkage |
|---|---|---|---|---|---|---|---|---|---|---|---|---|
| Example 1 | 250 μm | 82% | Titanium Dioxide | 7.0 g/m² | P-1 | 1.2 g/m² | C-1 | 10% | Included | 5 | 5 | 0.1% |
| Example 2 | 250 μm | 82% | Ultramarine Blue | 7.0 g/m² | P-1 | 1.2 g/m² | C-1 | 10% | Included | 5 | 5 | 0.3% |
| Example 3 | 250 μm | 82% | Carbon Black | 7.0 g/m² | P-1 | 1.2 g/m² | C-1 | 10% | Included | 5 | 5 | 0.1% |
| Example 5 | 250 μm | 82% | Titanium Dioxide | 7.0 g/m² | P-2 | 1.2 g/m² | C-1 | 10% | Included | 5 | 5 | 0.3% |
| Example 6 | 250 μm | 82% | Titanium Dioxide | 7.0 g/m² | P-3 | 1.2 g/m² | C-1 | 10% | Included | 5 | 5 | 0.3% |
| Example 7 | 250 μm | 82% | Titanium Dioxide | 7.0 g/m² | P-4 | 1.2 g/m² | C-1 | 10% | Included | 5 | 5 | 0.3% |
| Comp. Example 1 | 250 μm | 82% | Titanium Dioxide | 7.0 g/m² | P-101 | 1.2 g/m² | C-1 | 10% | Included | 5 | 1 | 0.3% |
| Comp. Example 2 | 250 μm | 82% | Titanium Dioxide | 7.0 g/m² | P-102 | 1.2 g/m² | C-1 | 10% | Included | 5 | 1 | 0.3% |
| Example 8 | 250 μm | 82% | Titanium Dioxide | 7.0 g/m² | P-1 | 1.2 g/m² | C-1 | 10% | None | 4 | 4 | 0.3% |
| Example 9 | 250 μm | 82% | Titanium Dioxide | 7.0 g/m² | P-1 | 1.2 g/m² | C-2 | 10% | Included | 5 | 5 | 0.3% |
| Example 10 | 250 μm | 82% | Titanium Dioxide | 7.0 g/m² | P-1 | 1.2 g/m² | C-1/C-2 | 5%/5% | Included | 5 | 5 | 0.1% |
| Example 11 | 250 μm | 82% | Titanium Dioxide | 7.0 g/m² | P-1 | 1.2 g/m² | | | Included | 4 | 3 | 0.3% |
| Example 12 | 250 μm | 82% | Titanium Dioxide | 7.0 g/m² | P-1 | 1.2 g/m² | C-101 | 10% | Included | 5 | 4 | 0.1% |
| Comp. Example 3 | 250 μm | 82% | Titanium Dioxide | 0.5 g/m² | P-1 | 1.2 g/m² | C-1 | 10% | Included | 5 | 2 | 0.3% |
| Example 13 | 250 μm | 82% | Titanium Dioxide | 3.5 g/m² | P-1 | 1.2 g/m² | C-1 | 10% | Included | 5 | 4 | 0.3% |
| Example 15 | 250 μm | 82% | Titanium Dioxide | 10.0 g/m² | P-1 | 1.2 g/m² | C-1 | 10% | Included | 5 | 5 | 0.3% |
| Example 16 | 250 μm | 82% | Titanium Dioxide | 14.0 g/m² | P-1 | 1.2 g/m² | C-1 | 10% | Included | 5 | 4 | 0.3% |
| Comp. Example 4 | 250 μm | 82% | Titanium Dioxide | 16.0 g/m² | P-1 | 1.2 g/m² | C-1 | 10% | Included | 5 | 2 | 0.1% |
| Example 17 | 250 μm | 82% | Titanium Dioxide | 7.0 g/m² | P-1 | 1.0 g/m² | C-1 | 10% | Included | 5 | 5 | 0.3% |
| Example 19 | 250 μm | 82% | Titanium Dioxide | 7.0 g/m² | P-1 | 2.4 g/m² | C-1 | 10% | Included | 5 | 5 | 0.3% |
| Example 20 | 250 μm | 82% | Titanium Dioxide | 7.0 g/m² | P-1 | 4.8 g/m² | C-1 | 10% | Included | 5 | 5 | 0.3% |
| Example 21 | 250 μm | 82% | Titanium Dioxide | 7.0 g/m² | P-1 | 7.2 g/m² | C-1 | 10% | Included | 5 | 5 | 0.3% |
| Example 22 | 250 μm | 82% | Titanium Dioxide | 7.0 g/m² | P-1 | 11.2 g/m² | C-1 | 10% | Included | 5 | 5 | 0.3% |
| Example 23 | 250 μm | 43% | Titanium Dioxide | 7.0 g/m² | P-1 | 1.2 g/m² | C-1 | 10% | Included | 5 | 3 | 0.1% |
| Comp. Example 5 | 250 μm | 82% | Corona-Treated Titanium Dioxide-Containing PET | | | | | | Included | 4 | 2 | |
| Example 24 | 250 μm | 82% | Titanium Dioxide | 7.0 g/m² | P-1 | 1.2 g/m² | C-1 | 1% | Included | 4 | 3 | 0.1% |
| Example 25 | 250 μm | 82% | Titanium Dioxide | 7.0 g/m² | P-1 | 1.2 g/m² | C-1 | 3% | Included | 5 | 4 | 0.1% |
| Example 26 | 250 μm | 82% | Titanium Dioxide | 7.0 g/m² | P-1 | 1.2 g/m² | C-1 | 5% | Included | 5 | 5 | 0.1% |
| Example 27 | 250 μm | 82% | Titanium Dioxide | 7.0 g/m² | P-1 | 1.2 g/m² | C-1 | 20% | Included | 5 | 5 | 0.1% |
| Example 28 | 250 μm | 82% | Titanium Dioxide | 7.0 g/m² | P-1 | 1.2 g/m² | C-1 | 30% | Included | 5 | 5 | 0.1% |
| Example 29 | 250 μm | 82% | Titanium Dioxide | 7.0 g/m² | P-1 | 1.2 g/m² | C-1 | 40% | Included | Many aggregates formed in coating layer | | |

P-1: R-1130 (silanol-modified PVA manufactured by Kuraray Co., Ltd)
P-2: PVA-105 (PVA manufactured by Kuraray Co., Ltd)
P-3: CHEMIPEARL S75N (polyolefin latex manufactured by Mitsui Chemicals, Inc)
P-4: JURYMER ET-410 (polyacryl latex manufactured by Nihon Junyaku Co., Ltd.)
P-101: FINTEX ES-650 (polyester latex manufactured by DIC Corp.)
P-102: OLESTER UD-350 (polyurethane latex manufactured by Mitsui Chemicals, Inc)
C-1: EPOCROS WS-700 (oxazoline crosslinking agent manufactured by Nippon Shokubai Co., Ltd)
C-2: CARBODILITE V-02-L2 (CARBODILITE cross linking agent manufactured by Nisshinbo Chemical Inc)
C-101: DENACOL EX144 (epoxy crosslinking agent manufactured by Nagase Chemtex Corporation)

As shown in Table 1, Examples exhibited good adhesion to the EVA encapsulant and good reflection. In contrast, Comparative Examples exhibited significantly less adhesion (especially in terms of adhesion after damp heat aging).

Disclosure of Patent Priority Number Japanese Patent Application No. 2010-254207 is incorporated herein by reference in its entirety.

All publications, patents, patent applications, and technical specifications described herein are incorporated herein by reference to the same extent as if individual publication, patent, patent application and technical specification was specifically and individually indicated to be incorporated by reference

INDUSTRIAL APPLICABILITY

The present invention can provide a solar cell backsheet which has good design or reflection and good adherence to an encapsulant and which is less likely to separate from the encapsulant after damp heat aging; and a solar cell module which can stably retain its electricity generation performance for a long time.

What is claimed is:

1. A backsheet for a solar cell, the backsheet comprising:
   a support; and
   a first polymer layer which is formed on one side of the support and which comprises:
      from 0.8 g/m² to 15.0 g/m² of a binder resin comprising at least one selected from the group consisting of a polyolefin ionomer having a polar group, a polyacryl, and polyvinyl alcohol; and
      from 1.5 g/m² to 15.0 g/m² of an inorganic pigment.

2. The backsheet according to claim 1, wherein the support comprises a polyester.

3. The backsheet according to claim 1, wherein the first polymer layer comprises the inorganic pigment in an amount of from 2.5 g/m² to 12.5 g/m², and the first polymer layer comprises the binder resin in an amount of from 1.0 g/m² to 12.5 g/m².

4. The backsheet according to claim 1, wherein the inorganic pigment is a white pigment, a black pigment, or a blue pigment.

5. The backsheet according to claim 1, wherein the first polymer layer comprises a structure portion derived from a crosslinking agent and wherein the first polymer layer comprises the structure portion in an amount of from 2% by mass to 30% by mass based on the total mass of the binder resin in the first polymer layer.

6. The backsheet according to claim 5, wherein the crosslinking agent is a carbodiimide crosslinking agent or an oxazoline crosslinking agent.

7. The backsheet according to claim 1, wherein the backsheet comprises, between the support and the first polymer layer, a second polymer layer which comprises at least a polymer.

8. The backsheet according to claim 1, wherein the backsheet has a ratio of an elongation at break after 50 hours of storage at 120° C. and 100% RH, to an elongation at break before the storage, of 50% or more.

9. The backsheet according to claim 1, wherein the backsheet has a shrinkage of 0.5% or less after 30 minutes of storage at 150° C.

10. The backsheet according to claim 1, wherein the backsheet comprises, on a surface on an opposite side from the surface of the support on which the first polymer layer is disposed, a weatherproof layer which comprises at least one of a fluorinated resin or a silicone-acrylic composite resin.

11. The backsheet according to claim 1, wherein the binder in the first polymer layer comprises at least one selected from the group consisting of:
a polyolefin ionomer having a polar group; and
polyvinyl alcohol.

12. The backsheet according to claim 1, wherein:
the support comprises a polyester;
the first polymer layer comprises the inorganic pigment in an amount of from 2.5 g/m² to 12.5 g/m², and the first polymer layer comprises the binder resin in an amount of from 1.0 g/m² to 12.5 g/m²;
the inorganic pigment is a white pigment, a black pigment, or a blue pigment;
the first polymer layer comprises a structure portion derived from a crosslinking agent and wherein the first polymer layer comprises the structure portion in an amount of from 2% by mass to 30% by mass based on the total mass of the binder resin in the first polymer layer;
the crosslinking agent is a carbodiimide crosslinking agent or an oxazoline crosslinking agent;
the backsheet comprises, between the support and the first polymer layer, a second polymer layer which comprises at least a polymer;
the backsheet has a ratio of an elongation at break after 50 hours of storage at 120° C. and 100% RH, to an elongation at break before the storage, of 50% or more;
backsheet comprises, on a surface on an opposite side from the surface of the support on which the first polymer layer is disposed, a weatherproof layer which comprises at least one of a fluorinated resin or a silicone-acrylic composite resin; and
the binder in the first polymer layer comprises at least one selected from the group consisting of: a polyolefin ionomer having a polar group; and polyvinyl alcohol.

13. A solar cell module comprising:
a photovoltaic element;
an encapsulant which encapsulates the photovoltaic element;
a top surface protection unit which is adhered to the encapsulant and which protects a light-receiving side; and
a back surface protection unit which is adhered to the encapsulant and which protects an opposite side from the light-receiving side,
wherein the back surface protection unit is the backsheet according to claim 1.

14. The backsheet according to claim 1, wherein a content of the inorganic pigment in the first layer is from 3.5 g/m² to 14.0 g/m².

15. The solar cell module according to claim 13, wherein a content of the inorganic pigment in the first polymer layer is from 3.5 g/m² to 14.0 g/m².

* * * * *